US010356862B2

(12) United States Patent
Bobbo et al.

(10) Patent No.: US 10,356,862 B2
(45) Date of Patent: Jul. 16, 2019

(54) PRINTED CIRCUIT BOARD, CORRESPONDING LIGHTING MODULE, LIGHTING SYSTEM AND METHOD FOR IMPLEMENTING LIGHTING MODULES

(71) Applicant: OSRAM GmbH, Munich (DE)

(72) Inventors: Simon Bobbo, Mirano (IT); Valerio Michielan, Mogliano Veneto (IT); Luca Volpato, Preganziol (IT)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/837,024

(22) Filed: Dec. 11, 2017

(65) Prior Publication Data

US 2018/0168009 A1 Jun. 14, 2018

(30) Foreign Application Priority Data

Dec. 12, 2016 (IT) .................. 102016000125049

(51) Int. Cl.
*H05B 33/08* (2006.01)
*H05K 1/11* (2006.01)
(Continued)

(52) U.S. Cl.
CPC ....... *H05B 33/083* (2013.01); *H05B 33/0803* (2013.01); *H05K 1/029* (2013.01);
(Continued)

(58) Field of Classification Search
CPC .......... H05K 13/00; H05K 1/11; H05K 1/181; H05K 2203/175; H05K 2203/173;
(Continued)

(56) References Cited

U.S. PATENT DOCUMENTS

2006/0201697 A1  9/2006  Chan et al.
2008/0144299 A1  6/2008  Redmond

FOREIGN PATENT DOCUMENTS

EP    2805101 A1    11/2014
WO    8911209 A1    11/1989
WO    2013107729 A1  7/2013

OTHER PUBLICATIONS

Italian Search Report based on application No. 201600125049 (8 pages) dated Sep. 4, 2017 (Reference Purpose Only).

*Primary Examiner* — Douglas W Owens
*Assistant Examiner* — Jianzi Chen
(74) *Attorney, Agent, or Firm* — Viering Jentschura & Partner MBB

(57) ABSTRACT

The printed circuit board includes metallic zones including: a first, second and third positive terminal, a first and second negative terminal, wherein the second negative terminal is connected to the first negative terminal, and electric contacts for the mounting of one or more LEDs and electric traces such that the LEDs are connected in series forming a LED string. The printed circuit board comprises selection means implemented with electric traces and metallic contacts adapted to be short-circuited via links in order to permit all of the following connections: a connection of the LED string between the first and third positive terminal, a connection of the LED string between the first positive terminal and the first negative terminal, a connection of the LED string between the second and third positive terminal, and a connection of the LED string between the second positive terminal and the first negative terminal.

10 Claims, 13 Drawing Sheets

(51) Int. Cl.
*H05K 1/18* (2006.01)
*H05K 13/00* (2006.01)
*H05K 1/02* (2006.01)
*H05K 3/22* (2006.01)

(52) U.S. Cl.
CPC ............... *H05K 1/11* (2013.01); *H05K 1/181* (2013.01); *H05K 13/00* (2013.01); *H05K 3/222* (2013.01); *H05K 2201/10106* (2013.01); *H05K 2201/10363* (2013.01); *H05K 2203/0228* (2013.01); *H05K 2203/173* (2013.01); *H05K 2203/175* (2013.01)

(58) Field of Classification Search
CPC ......... H05K 2201/10363; H05K 3/222; H05K 2201/10106
See application file for complete search history.

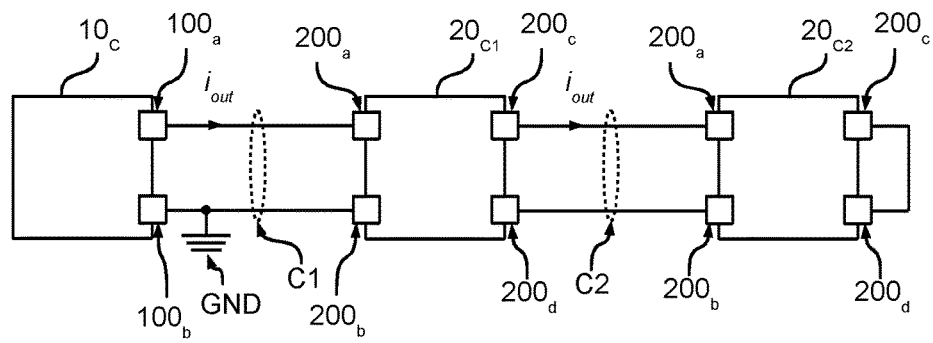
Fig. 3    (Prior Art)
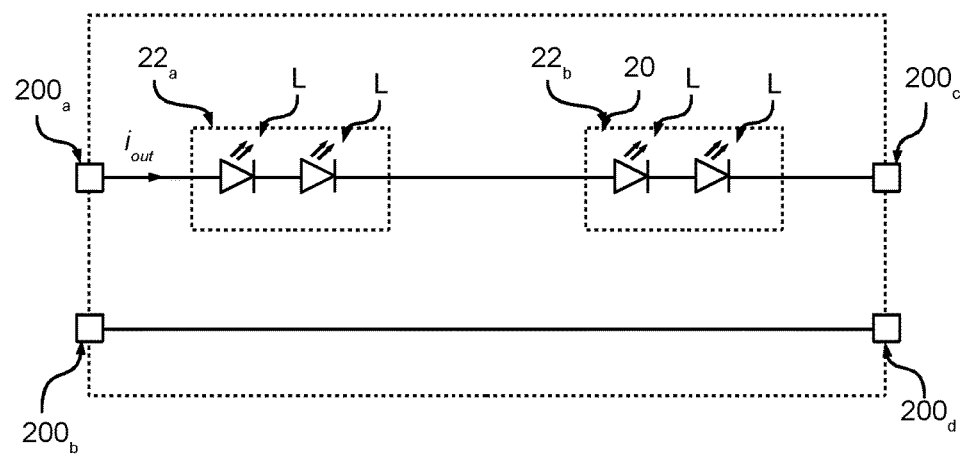
Fig. 4    (Prior Art)

PRINTED CIRCUIT BOARD, CORRESPONDING LIGHTING MODULE, LIGHTING SYSTEM AND METHOD FOR IMPLEMENTING LIGHTING MODULES

CROSS-REFERENCE TO RELATED APPLICATIONS

This application claims priority to Italian Patent Application Serial No. 102016000125049, which was filed Dec. 12, 2016, and is incorporated herein by reference in its entirety.

TECHNICAL FIELD

The description relates to printed circuit boards for lighting modules and to corresponding lighting modules.

BACKGROUND

A lighting system typically includes an electronic converter 10 and at least one lighting module 20.

For example, the electronic converter 10 may include an AC/DC or DC/DC switching supply, receiving at input a supply signal (e.g. from the mains or from a battery) and providing at output a regulated voltage $V_{out}$ or a regulated current $i_{out}$.

A lighting module 20 includes one or more light radiation sources including e.g. at least one LED (Light Emitting Diode) or other solid-state lighting means such as e.g. laser diodes.

For example, FIG. 1 shows a system wherein the electronic converter is a voltage generator $10_V$ and similarly the lighting modules 20 are modules $20_V$ configured to be supplied with a voltage. For example, FIG. 1 shows two lighting modules $20_{V1}$ and $20_{V2}$.

Therefore, in FIG. 1, the electronic converter $10_V$ provides at output, via a positive terminal 100a and a negative terminal 100b, which represents a ground GND, a regulated voltage $V_{out}$.

For example, FIG. 2 shows an example of a lighting module $20_V$ configured to be supplied with a regulated voltage $V_{out}$.

Specifically, lighting module $20_{V1}$ includes a positive input terminal 200a and a negative input terminal 200b, for the connection to the terminals 100a and 100b of electronic converter $10_V$. For example, lighting module $20_V$ may be connected, via a cable C1, to the electronic converter $10_V$. Therefore, terminal 200a is connected to terminal 100a, and terminal 200b is connected to terminal 100b, and therefore the lighting module 20 receives the voltage $V_{out}$.

In the presently considered example, the lighting module $20_V$ is a LED module including one or more LEDs L connected between the terminals 200a and 200b. For example, module $20_V$ may include a LED chain or string 22, wherein a plurality of LEDs is connected in series. Moreover, the LEDs L may also be distributed onto various branches connected in parallel. For example, as shown in FIG. 2, module $20_V$ may include a first LED string 22a including a first set of LEDs connected in series, and a second LED string 22b including a second set of LEDs L connected in series.

As the lighting module $20_V$ is supplied with a voltage, the lighting module 20 includes a current regulator 24 connected in series with each LED string 22. For example, in FIG. 2, the first LED string 22a and a first current regulator 24 are connected (e.g. directly) in series between the terminals 200a and 200b, and the second LED string 22b and a second current regulator 24 are connected (e.g. directly) in series between the terminals 200a and 200b.

Therefore, in the presently considered example, the strings 22a and 22b are supplied with a common voltage ($V_{out}$). In this case, the LED strings 22 with the respective current regulators 24 included in the various lighting modules $20_V$ should be connected in parallel at the voltage $V_{out}$ provided by the electronic converter $10_V$. As a consequence, also the lighting modules $20_V$ should be electrically connected in parallel to voltage $V_{out}$.

For example, in FIGS. 1 and 2, the lighting module $20_{V1}$ also includes a positive output terminal 200c and a negative output terminal 200d, for the connection to a following lighting module, for example module $20_{V2}$. Specifically, said terminals 200c/200d are connected (e.g. directly) to the terminals 200a/200b. Therefore, the voltage ($V_{out}$) received at the terminals 200a and 200b is also applied to the terminals 200c and 200d.

Therefore, the terminals 200a and 200b of the lighting module $20_{V2}$ may be connected (directly or via a cable C2) to the terminals 100a and 100b of the electronic converter $10_V$, or to the terminals 200c and 200d of the lighting module $20_{V1}$, which again provide the voltage $V_{out}$. As a consequence, although modules $20_{V1}$ and $20_{V2}$ are connected in series from a mechanical point of view, the electric connection is in parallel.

In the simplest instance, the current regulator 24 may be a resistor or a linear current regulator. The current regulator 24 may also be implemented by means of current mirrors or a switched mode current source regulator, typically including an inductor and an electronic switch.

On the other hand, FIG. 3 shows a system wherein the electronic converter is a current generator $10_C$, and similarly the lighting modules 20 are modules $20_C$ configured to be supplied with a current. For example, FIG. 3 shows two lighting modules $20_{C1}$ and $20_{C2}$.

Therefore, in FIG. 3, the electronic converter $10_C$ provides at output via the positive terminal 100a and the negative terminal 100b, which again represents a ground GND, a regulated current $i_{out}$.

With a regulated current, the LEDs L distributed throughout the various lighting modules 20 are connected in series between the terminals 100a and 100b.

Generally speaking, also in this case, each lighting module $20_C$ includes two terminals 200a and 200b. For example, if only one single lighting module $20_C$ may be connected to the electronic converter $10_C$, the LEDs L of said module are connected in series between the terminals 200a and 200b.

On the other hand, in FIG. 3, a plurality of lighting modules $20_C$ may be connected to converter $10_C$. In this case, each lighting module $20_C$ moreover includes two terminals 200c and 200d for the connection to the terminals 200a and 200b of a following lighting module $20_C$. In this case, the terminals 200c and 200d of the last lighting module $20_C$, for example module $20_{C2}$, are short-circuited (internally or externally) to close the current path. As regards such a connection, mention may be made of document EP 2 805 101, the content whereof is incorporated herein by way of reference.

In this case, as shown in FIG. 4, the LEDs L of each lighting module $20_C$ may be connected in series between the terminals 200a and 200c and/or between the terminals 200d and 200b.

For example, in the presently considered embodiments, two LED strings 22a and 22b are connected in series between the terminals 200a and 200c, and terminal 200d is connected (e.g. directly) to terminal 200b.

Generally speaking, also in this case, a plurality of LED strings may be connected in parallel, optionally having a resistor connected in series in order to improve the current distribution among the various strings. The person skilled in the art will appreciate that this solution is rather basic, because if LED strings are added or removed it is necessary to adapt the current provided by the electronic converter.

Therefore, the lighting modules 20 have a structure which changes as a function of the envisaged supply (voltage or current supply). Moreover, according to the needs, each lighting module 20 may include a different number of LEDs.

Consequently, in order to improve the characteristics of a lighting module 20, in particular as regards efficiency, light emission and LED pitch, the lighting module 20 must be designed specifically. For example, the designer must choose the correct LEDs, e.g. as regards spectral characteristic (colour) and brightness, and he must design a rigid or a flexible printed circuit board. While designing said printed circuit board, the designer must also take into account the electric configuration of the circuit (current or voltage driving) and the sizing specifications of the printed circuit board.

Therefore, these parameters must be taken into account each time the requirements vary, leading to the need of developing a different lighting module for each new application. As a consequence, also the designed printed circuit boards will be different from each other, which increases the manufacturing and storage cost of the printed circuit boards.
a. However, solutions are known which enable a partial re-use of the printed circuit boards of other products. For example, with reference to FIG. 2, the LEDs L of a module $20_V$ may easily be replaced with LEDs of a different colour. Moreover, the brightness of module $20_V$ may be varied, by modifying the current flowing through the LED string 22, e.g. by adapting current regulator 24 e.g. by modifying the reference resistor of a corresponding current regulator.

Also the lighting modules $20_C$ with current supply may be re-used. For example, document EP 2 805 101 A1 shows LED modules which may be cut to different lengths. However, in case of a change of the supply current for the lighting modules $20_C$, the electronic converter $10_C$ must be adapted.

SUMMARY

The present description aims at providing solutions for implementing rigid or flexible printed circuit boards for lighting modules which may be re-used more easily.

According to one or more embodiments, said object is achieved thanks to a printed circuit board having the features set forth in the claims that follow. The claims also concern a corresponding lighting module, lighting system and method for implementing lighting modules.

The claims are an integral part of the technical teaching provided herein with reference to the present disclosure.

As mentioned in the foregoing, various embodiments of the present specification concern a printed circuit board for a lighting module.

In various embodiments, the printed circuit board includes metallic zones including a first positive terminal and a first negative terminal, typically used for the connection to an electronic converter. In various embodiments, the metallic zones also include a second positive terminal, which may be used for connecting the respective lighting module to a previous module. Moreover, the metallic zones may include a third positive terminal and a second negative terminal (connected via an electric trace to the first negative terminal) which may be used for connecting the respective lighting module to a following module. In various embodiments, the printed circuit board may include a fourth positive terminal, connected (via an electric trace to the first negative terminal) to the first positive terminal. For example, this terminal may be useful if a plurality of lighting modules are connected in parallel to the electronic converter.

In various embodiments, the metallic zones moreover include electric contacts for mounting one or more LEDs, and electric traces between these contacts, so that the LEDs are connected in series by forming a LED string.

In various embodiments, the printed circuit board includes selection means, implemented by means of electric traces and metallic contacts adapted to be short-circuited via links, so as to enable all the following connections:
a) a connection of the LED string between the first positive terminal and the third positive terminal,
b) a connection of the LED string between the first positive terminal and the first negative terminal,
c) a connection of the LED string between the second positive terminal and the third positive terminal, and
d) a connection of the LED string between the second positive terminal and the first negative terminal.

Therefore, the selection means enable configuring the lighting module either as a single module or as the first, intermediate or last module of a chain of modules.

For example, in various embodiments, it is determined whether the lighting module is a single lighting module or if it belongs to a string of lighting modules.

If the lighting module is a single lighting module, the selection means are set so that the LED string is connected between the first positive terminal and the first negative terminal, alternatively between the second positive terminal and the first negative terminal.

On the contrary, if the lighting module belongs to a string of lighting modules, it is determined (at least) whether the lighting module is the first or the last lighting module of the string of lighting modules. If the lighting module is the first lighting module of the string of lighting modules, the selection means are set so that the LED string is connected between the first positive terminal and the third positive terminal, or alternatively between the second positive terminal and the third positive terminal. On the other hand, if the lighting module is the last lighting module of the string of lighting modules, the selection means are set so that the LED string is connected between the second positive terminal and the first negative terminal. Finally, if the lighting module is an intermediate module of the string of lighting modules, the selection means are set so that the LED string is connected between the second positive terminal and the third positive terminal.

In various embodiments, the selection means may include:
a first set of two contacts, connected via electric traces between the first positive terminal and the positive terminal of the LED string;
a second set of two contacts, connected via electric traces between the second positive terminal and the positive terminal of the LED string;
a third set of two contacts, connected via electric traces between the negative terminal of the LED string and the third positive terminal; and
a fourth set of two contacts, connected via electric traces between the negative terminal of the LED string and the first negative terminal.

For example, in various embodiments, both contacts of said sets are metallic contacts having a SMD format 1H/0201, 1E/0402, 1J/0603, 2A/0805 or 2B/1206.

Therefore, in various embodiments, the lighting module includes a printed circuit board, wherein one or more LEDs are mounted on the printed circuit board. Moreover, both contacts of the first set or alternatively of the second set are closed via a link, and both contacts of the third set or alternatively of the fourth set are closed via a link.

In various embodiments, the printed circuit board includes bypass means, implemented by means of electric traces, and/or metallic contacts configured to be short-circuited, in order to selectively bypass one or more of the LEDs.

In various embodiments, the printed circuit board may include electric contacts for mounting or implementing a current regulator, and further bypass means implemented by means of electric traces and/or metallic contacts, configured to be short-circuited in order to selectively bypass the current regulator. For example, said regulator and the respective bypass means may be used in order to implement lighting modules which may be supplied with a regulated voltage or alternatively with a regulated current.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings in which:

FIG. 3 shows a two lighting module lighting system;

FIG. 4 shows an embodiment of a lighting system with the LEDs of each lighting module connected in series;

DETAILED DESCRIPTION

Figure 1:
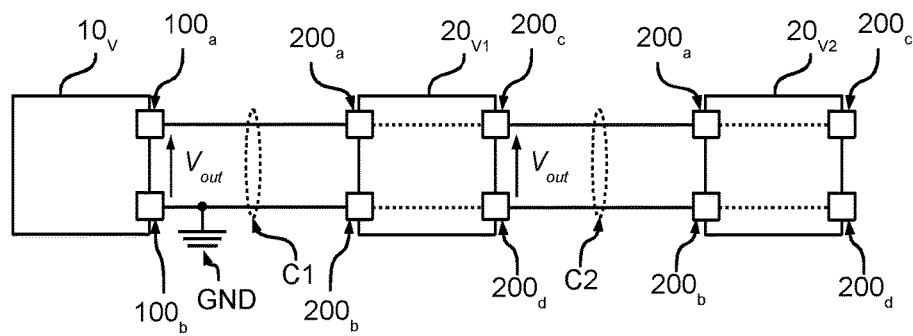
FIG. 1 shows an embodiment of an electric circuit of a lighting system.
Figure 2:
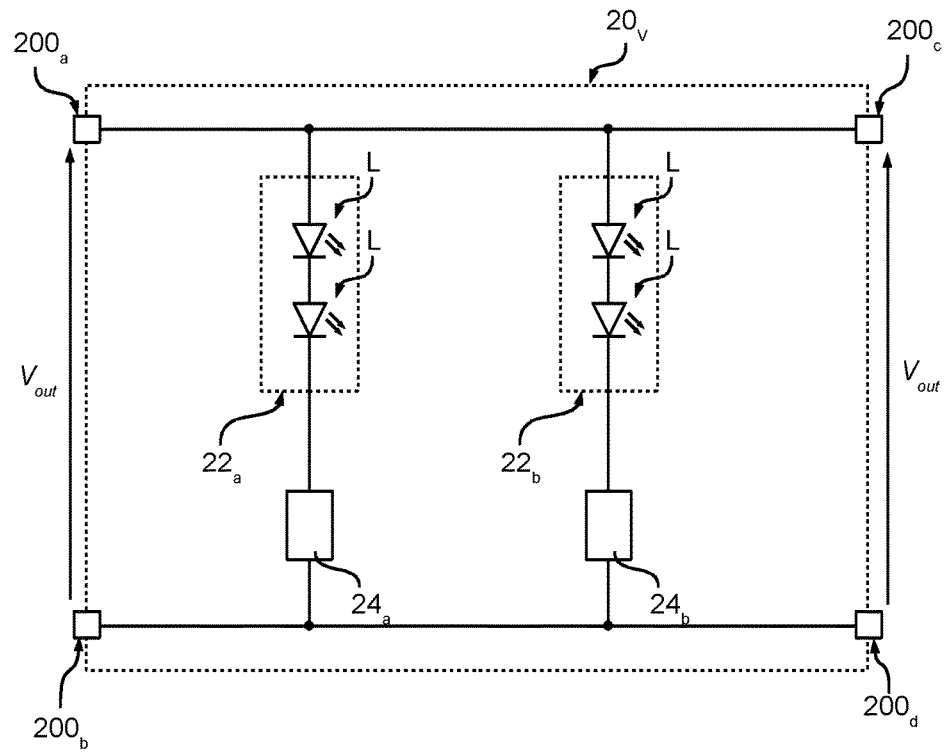
FIG. 2 shows and embodiment of a lighting system.

In the following description, various specific details are given to provide a thorough understanding of the embodiments. The embodiments may be practiced without one or several specific details, or with other methods, components, materials, etc. In other instances, well-known structures, materials, or operations are not shown or described in detail in order to avoid obscuring various aspects of the embodiments.

Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings provided herein are for convenience only, and therefore do not interpret the extent of protection or scope of the embodiments.

In the following FIGS. 5 to 20, the parts, the elements or the components which have already been described with reference to the FIGS. 1 to 4 are denoted with the same references previously used in said Figures; the description of said previously described elements will not be repeated in the following in order not to overburden the present detailed description.

As mentioned in the foregoing, the present description provides solutions for implementing printed circuit boards which may be used for different lighting modules.

For example, various embodiments enable the implementation of printed circuit boards having one or more of the following advantages:

a variable number of LEDs may be mounted onto the printed circuit board, thereby varying the LED pitch, i.e. the distance between two successive LEDs;

the same printed circuit board may be used in order to implement lighting modules with voltage or current supply;

the same printed circuit board may be used with different supply voltages, e.g. 12 VDC, 24 VDC o 48 VDC.

In various embodiments, the advantages mentioned in the foregoing may be achieved by a single printed circuit board, which may be reconfigured. For example, in various embodiments, some electric connections may be enabled selectively via jumpers or by soldering resistors or bridges/wire links, such as zero-Ohm resistors, onto the printed circuit board.

In various embodiments, the same printed circuit board may therefore be used in order to implement:

supply modules $20_V$ configured to be supplied with a given voltage, e.g. 24 VDC, and having a given number of LEDs, e.g. six LEDs, considering the typical junction voltages of white LEDs;

lighting modules $20_V$ configured to be supplied with the same voltage and having half the number of LEDs mounted;

lighting modules $20_V$ configured to be supplied with a higher voltage, e.g. 48 VDC;

lighting modules $20_V$ configured to be supplied with a lower voltage, e.g. 12 VDC;

lighting modules $20_C$ configured to be supplied with a constant current, also enabling the implementation of chains of lighting modules $20_C$;

lighting modules $20_C$ configured to be supplied with a constant current, also enabling a parallel connection of a plurality of chains of supply modules $20_C$.

Moreover, various embodiments may also be employed for solutions wherein the light emitted by two LED strings (distributed on one or more LED modules) may be adjusted (so-called dimming) independently, therefore leading to the implementation of systems wherein the colour of the emitted light may be varied. For example, if the emitted light is always white, such systems are typically known as "tunable white LED system".

Figure 5:
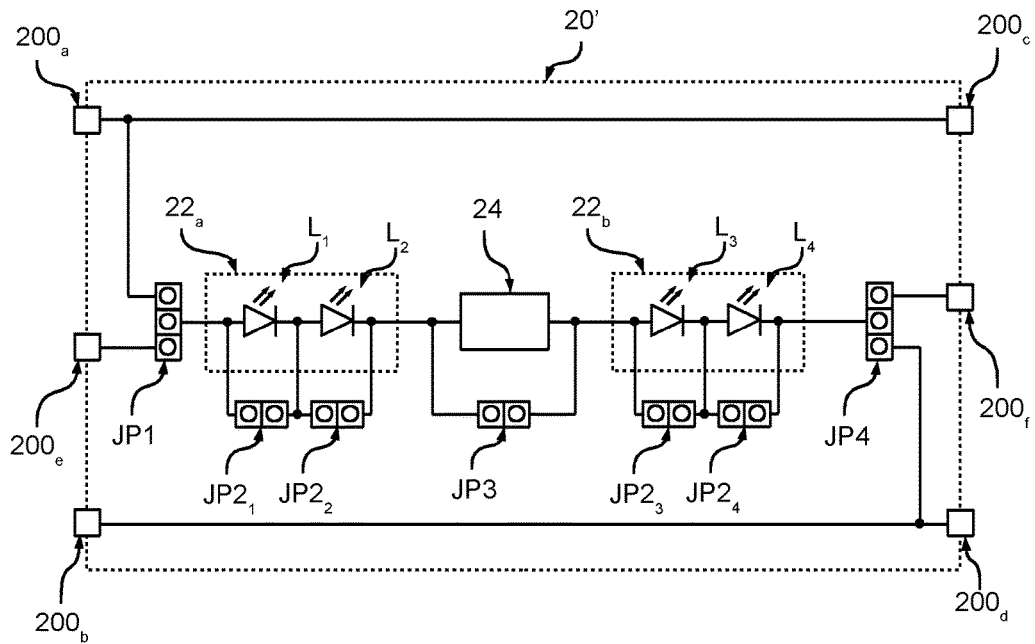
FIG. 5 shows a first embodiment of the electric circuit of a printed circuit board of a lighting module according to the present specification.

FIG. 5 shows a first embodiment of the electric arrangement of the printed circuit board of a lighting module 20' according to the present specification.

In the presently considered embodiment, the printed circuit board/lighting module 20' includes six terminals 200a-200f. Specifically, the positive terminal 100a and the negative terminal 100b, representing a ground, enable the reception of a supply signal from an electronic converter 10. On the other hand, the positive terminal 100c and the negative terminal 100d may be used for providing said supply signal to another lighting module 20'. For this purpose, the positive terminal 100c is connected (within module 20' and e.g. directly via electric traces) to terminal 100a, and the negative terminal 100d is connected (within module 20' and e.g. directly via electric traces) to terminal 100b. The terminals 100e and 100f enable a connection in series of a plurality of modules 20', and the operation of said terminals will be described in the following.

In the presently considered embodiment, module 20' includes a plurality of light radiation sources L, such as e.g. LEDs or other solid-state lighting means, i.e. the printed circuit board includes contacts for mounting said LEDs L. For example, in the presently considered embodiment, module 20' includes four LEDs $L_1$, $L_2$, $L_3$ and $L_1$. Generally speaking, said LEDs L may be distributed in one or more LED strings 22. Therefore, generally speaking, lighting module 20' includes one or more LED strings 22, and each LED string 22 includes one or more LEDs L which are connected (e.g. directly) in series, i.e. the printed circuit board includes electric traces configured so that the LEDs L are connected in series. For example, in FIG. 5, module 20' includes a first LED string $22_a$ including two LEDs $L_1$ and $L_2$ connected in series, and a second LED string $22_b$ including two LEDs $L_3$ and $L_4$ connected in series. For example, in various embodiments, each lighting module 20' employs a printed circuit board enabling mounting six LEDs L, which may be distributed in strings 22a and 22b.

In various embodiments, the printed circuit board/lighting module 20' includes selection means JP1 and JP4, which enable four different connections of the LED string(s) 22 to the terminals 200a-200f of the lighting module 20'.

Specifically, said means enable the following connections:

a connection in series of the LED string(s) 22 between terminal 200a and terminal 200f, a connection in series of the LED string(s) 22 between terminal 200a and terminal 200b or terminal 200d, a connection in series of the LED string(s) 22 between terminal 200e and terminal 200f, and a connection in series of the LED string(s) 22 between terminal 200e and terminal 200b or terminal 200d.

For example, in the presently considered embodiment, the means are implemented via connectors JP3 and JP4 which may be short-circuited via so-called jumpers. For example, the connectors may be so-called "pin header strips", i.e. strips including pins. As will be described in the following, such configuration/selection connectors may also be implemented via other electric contacts on the printed circuit board, i.e. metallic zones which are not covered by the so-called "solder mask", which may be short-circuited via jumpers which are soldered onto the printed circuit board. Typically, said jumpers are generally denoted as links or wire links, and the term jumper is normally used in the context of connectors (so-called jumper blocks).

Specifically, the presently considered embodiment employs a first connector with three contacts JP3, wherein the central contact is connected to the positive terminal of the first LED string, e.g. to the anode of diode $L_1$. On the other hand, the external contacts are connected (e.g. directly) respectively to terminal 200a and to terminal 200e. Therefore, a simple link may be used to connect the positive terminal of the first LED string to terminal 200a or to terminal 200e.

Similarly, it is possible to resort to a second connector having three contacts JP4, the central contact whereof is connected to the negative terminal of the last LED string, e.g. to the cathode of diode $L_4$. On the other hand, the external contacts are connected (e.g. directly) respectively to terminal 200f and to terminal 200d. Therefore, a simple link may be used for connecting the negative terminal of the last LED string to terminal 200f or to terminal 200d.

Figure 6:
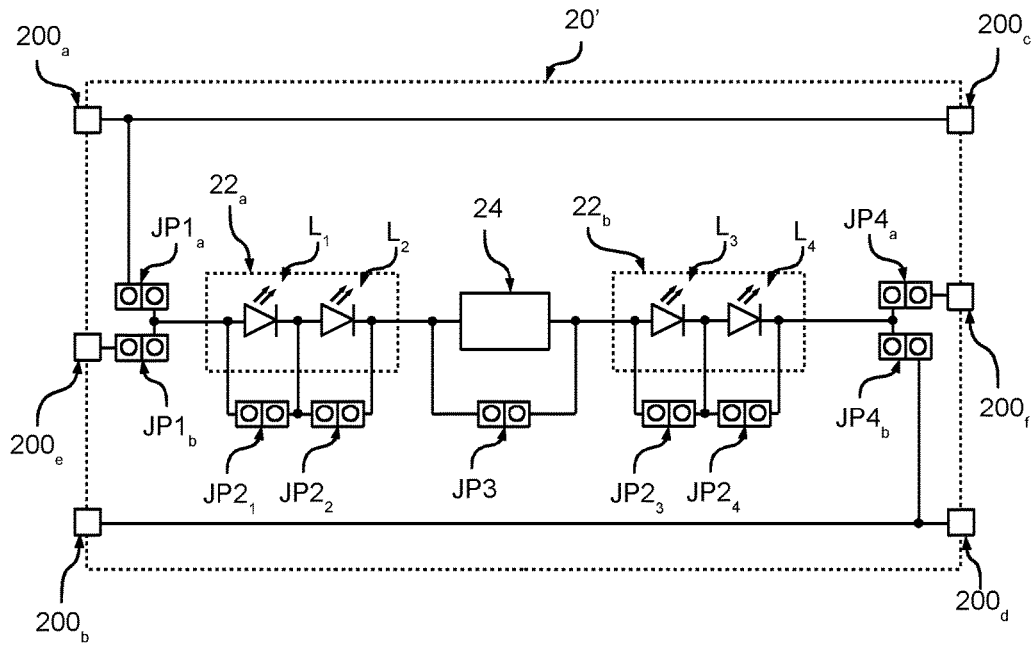
FIG. 6 shows a second embodiment of the electric circuit of a printed circuit board of a lighting module according to the present specification.

On the other hand, FIG. 6 shows an embodiment wherein the connector JP1 and/or the connector JP4 having three contacts of FIG. 5 have been replaced respectively with two connectors with two contacts $JP1_a/JP1_b$ and $JP4_a/JP4_b$.

Therefore, also in this case, a link may be used to connect the positive terminal of the first LED string to terminal 200a (by short-circuiting connector $JP1_a$) or to terminal 200e (by short-circuiting connector $JP1_b$). Similarly, a link may be used to connect the negative terminal of the last LED string to terminal 200f (by short-circuiting connector $JP4_a$) or to terminal 200d (by short-circuiting connector $JP4_b$).

In various embodiments, each LED string 22 and/or each LED L may have means JP2 associated thereto in order to bypass, i.e. short-circuit, the respective LED string 22 or the respective LED L.

For example, in the FIGS. 5 and 6, each LED $L_1$, $L_2$, $L_3$ and $L_4$ has, connected in parallel thereto, a connector having two contacts $JP2_1$, $JP2_2$, $JP2_3$ and $JP2_4$, which therefore may be closed via a link, thereby bypassing the respective LED L. For example, these connectors JP2 may be employed to bypass the connection terminals on a printed circuit board, if the respective LED is not mounted on the printed circuit board.

In various embodiments, a current regulator 24 may be connected in series with the LED string(s) 22, i.e. the printed circuit board includes the contacts and optionally the respective electric traces, for mounting or implementing a current regulator 24. For example, in the presently considered embodiment, the current regulator 24 is connected between the first LED string $22_a$ and the second LED string $22_b$. Therefore, in various embodiments, the lighting module 20' includes one or more LED strings 22 and a current regulator 24, which are connected (e.g. directly) in series.

Generally speaking, also said regulator 24 may have means JP3 associated thereto for bypassing, i.e. short-circuiting, the current regulator 24.

For example, in the FIGS. 5 and 6, regulator 24 has, connected in parallel thereto, a connector having two contacts JP3, which therefore may be closed via a link, therefore bypassing regulator 24. For example, this connector JP3 may be used for bypassing the connection terminals on a printed circuit board, if the current regulator 24 is not required.

Therefore, in the presently considered embodiments, connectors/electric contacts and links are used in order to modify the electric connection of the LEDs L and optionally of the current regulator 24 with respect to the terminals 200a-200f.

Figure 7:
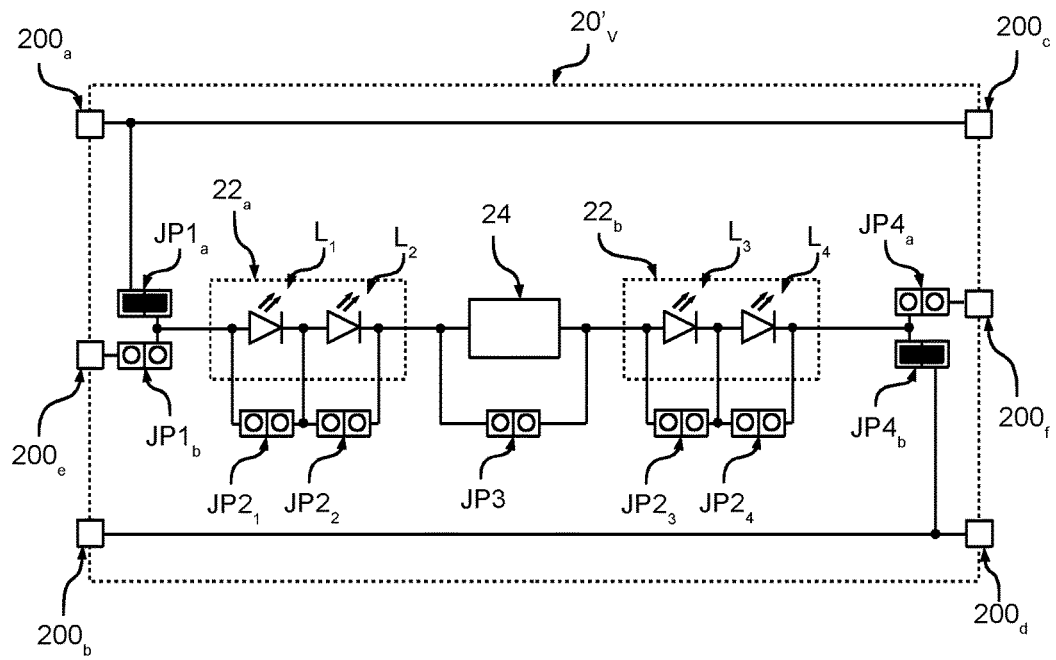
FIG. 7 shows a first embodiment of the arrangement of the electric circuit of FIG. 6, so as to implement a lighting module adapted to be supplied with a voltage.
Figure 8:
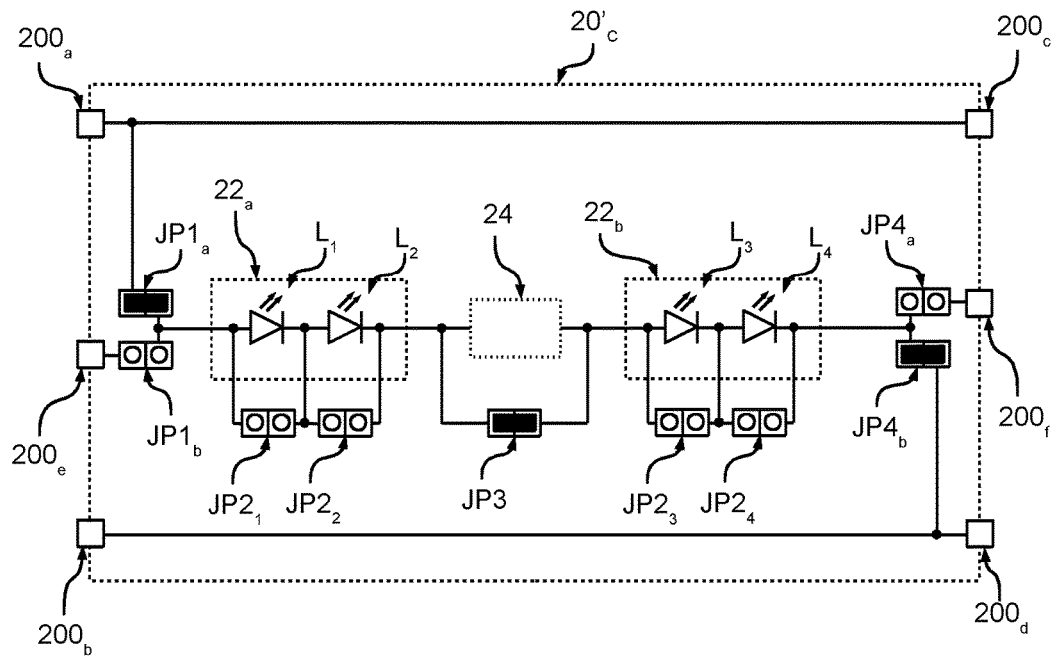
FIG. 8 shows a second embodiment of the arrangement of the electric circuit of FIG. 6, so as to implement a lighting module adapted to be supplied with a current.

For example, FIGS. 7 and 8 show two embodiments of the electric connection of the printed circuit board shown in FIG. 6.

Specifically, FIG. 7 shows the electric connection to implement a lighting module $20'_V$ configured to be supplied with a regulated voltage $V_{out}$ provided via the terminals 200a and 200b.

Therefore, in the presently considered embodiment, the means JP1 are configured to connect the positive terminal of the first LED string 22a to the terminal 200a. For example, in the presently considered embodiment, a link short-circuits the connector/electric contact $JP1_a$. Similarly, the means JP4 are configured to connect the negative terminal of the last LED string 22b to the terminal 200b. For example, in the presently considered embodiment, a link short-circuits the connector/electric contact $JP4_b$.

Therefore, in the presently considered embodiment, the LEDs L of the lighting module $20'_V$ are connected in series between the terminals 200a and 200b. As described with reference to FIG. 2, in this case the printed circuit board also hosts the current regulator 24 connected in series with the LEDs L, i.e. the current regulator 24 is not bypassed.

Module $20'_V$ may therefore be used in the lighting system described with reference to FIG. 1, and the corresponding description is applicable thereto in its entirety.

Generally speaking, also a plurality of lighting modules $20'_V$ as shown in FIG. 7 may be connected in parallel (see also FIG. 1).

Figure 9:
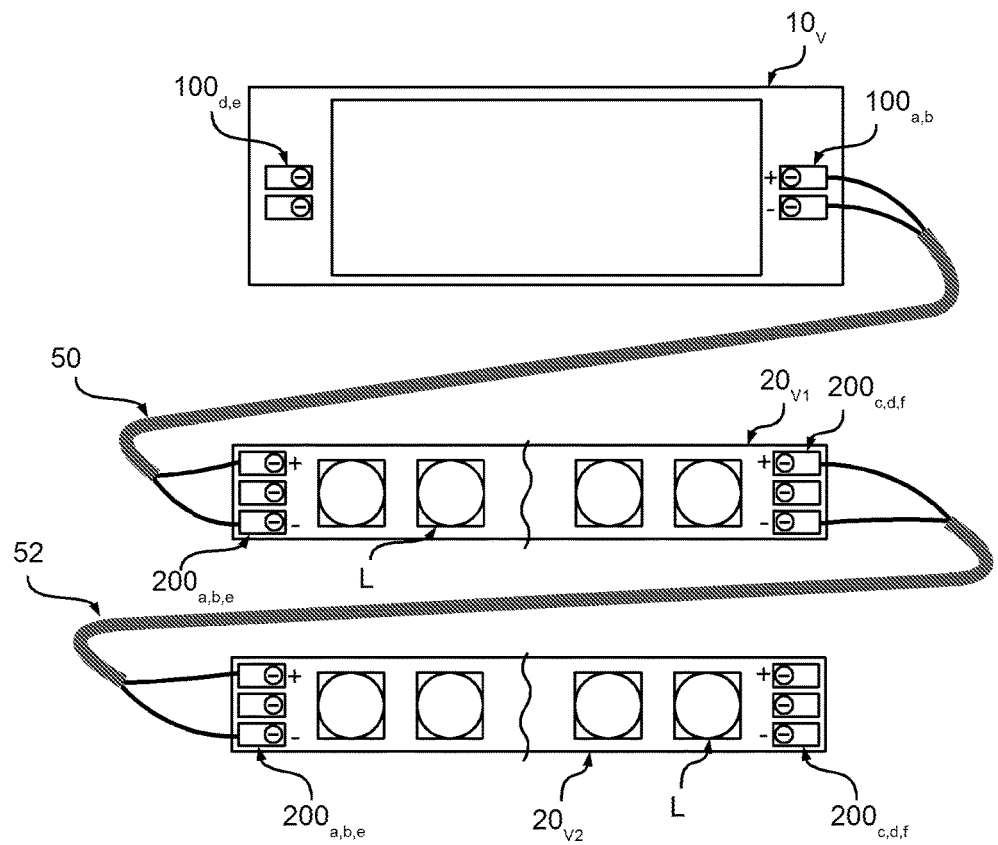
FIG. 9 shows an embodiment of the connection of a plurality of lighting modules with an electronic converter, configured to provide a regulated voltage.

For example, FIG. 9 shows a possible embodiment wherein a plurality of lighting modules $20'_V$, for example two modules $20'_{V1}$ and $20'_{V2}$, are connected in parallel to an electronic converter $10_V$, i.e. to a converter providing a regulated voltage $V_{out}$.

Specifically, the positive supply terminals 100a, 200a and 200c are denoted with "+" and the negative supply terminals 100b, 200b and 200d are denoted with "−". On the contrary, terminals 200e and 200f have no additional sign.

Specifically, in the presently considered embodiment, the electronic converter $10_V$, the first lighting module $20_{V1}$ and a second lighting module $20_{V2}$ are connected to each other via cables.

For example, in the presently considered embodiment, the terminals 100a and 100b of the electronic converter $10_V$ are implemented by way of rapid connection means, e.g. a screw or spring type terminal block, having e.g. two contacts. As previously stated, the electronic converter $10_V$ moreover includes two terminals 100d and 100e to be connected to a power source, e.g. the mains or a battery. For example, also these terminals 100d and 100e may be implemented by means of a terminal block.

Similarly, also the terminals 200a, 200b, 200c, 200d, 200e and 200f of the lighting modules $20'_V$ may be implemented by rapid connection means, for example screw or spring type terminal blocks, having e.g. three contacts which are soldered to respective contacts on the printed circuit board.

Therefore, in the presently considered embodiment, the first lighting module $20_{V1}$ (specifically the terminals 200a and 200b) is connected to the electronic converter 10 (specifically to the terminals 100a and 100b) by means of a first electric cable 50, having e.g. two wires. Moreover, the second lighting module $20_{V2}$ (specifically the terminals 200a and 200b) is connected to the first lighting module $20_{V1}$ (specifically to the terminals 200c and 200d) by means of a first electric cable 52, having e.g. two wires.

Therefore, in the presently considered embodiment, the terminals 200e and 200f are unused.

Figure 10:
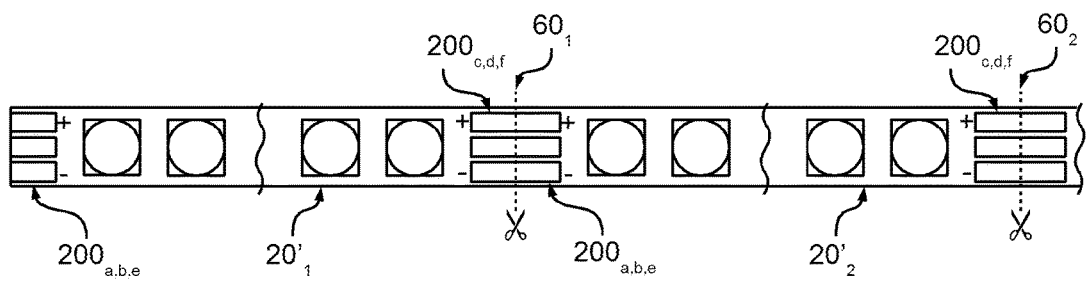
FIG. 10 shows an embodiment of a printed circuit board including a plurality of lighting modules connected in cascade.

On the other hand, FIG. 10 shows an embodiment wherein the electric connection between a first lighting module $20_1$ and a second lighting module $20_2$ is already implemented during the production of the printed circuit board.

Specifically, in the presently considered embodiment only one printed circuit board is implemented which includes one string of lighting modules 20'. In this case, the contacts 200c and 200a between two successive lighting modules 20' may be implemented by means of a single metallic zone. Similarly, the contacts 200f and 200e, as well as 200d and 200b, may be implemented by means of respective metallic zones.

Therefore, said terminals are already connected, and the module string may be cut transversally along lines 60, in such a way as to sever again contacts 200c/200a, 200f/200e and 200d/200b between two successive lighting modules 20'.

On the other hand, FIG. 8 shows the electric connection for implementing a lighting module $20'_C$ configured to be supplied with a regulated current $i_{out}$ provided through terminals 200a and 200b.

As a consequence, in the presently considered embodiment, the means JP1 are configured to connect the positive terminal of the first LED string 22a to the terminal 200a. For example, in the presently considered embodiment, a link short-circuits the connector/electric contact $JP1_a$. Similarly, the means JP4 are configured to connect the negative terminal of the last LED string 22b to the terminal 200b. For example, in the presently considered embodiment, a link short-circuits the connector/electric contact $JP4_b$.

Therefore, in the presently considered embodiment, the LEDs L of lighting module $20'_C$ are connected in series between the terminals 200a and 200b. As previously described, in this case, the current regulator 24 is not required, and the current regulator 24 (which in this case may not be mounted on the printed circuit board) is bypassed by means of a link which short-circuits the connector/electric contact JP3.

The presently considered embodiment therefore connects the LEDs L of lighting module $20'_C$ directly between the terminals 200a and 200b.

However, if a plurality of lighting modules $20'_C$ are supplied with the same current $i_{out}$, the LEDs L of all the modules $20'_C$ are advantageously connected in series. For this purpose it is possible to use the terminals 200e and 200f.

Figure 11A:
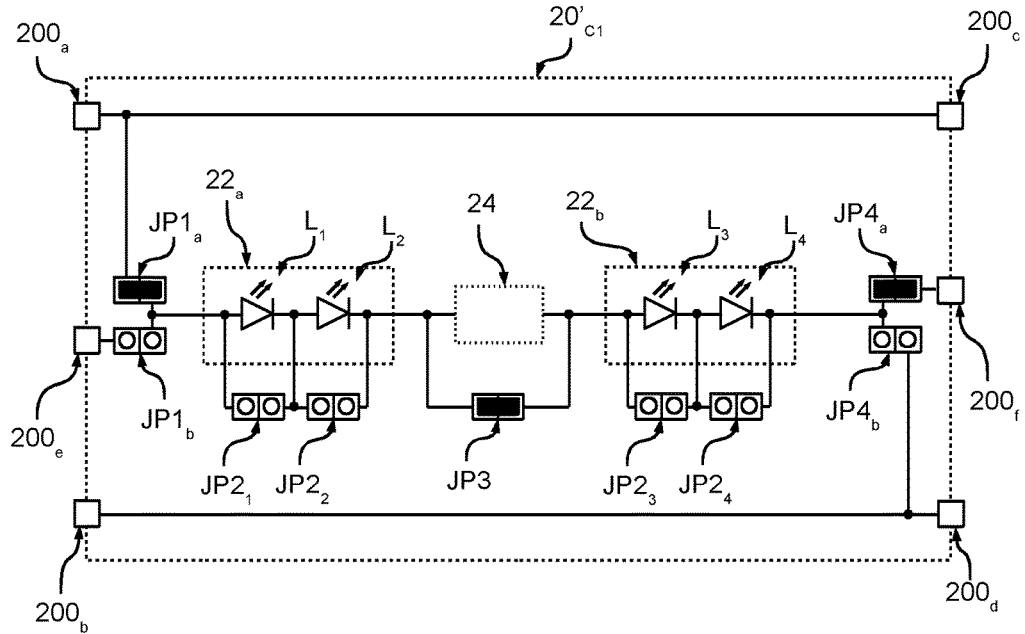
FIGS. 11a and 11b show an embodiment of the arrangement of the electric circuit of FIG. 6, in order to implement lighting modules connected in cascade.
Figure 11B:
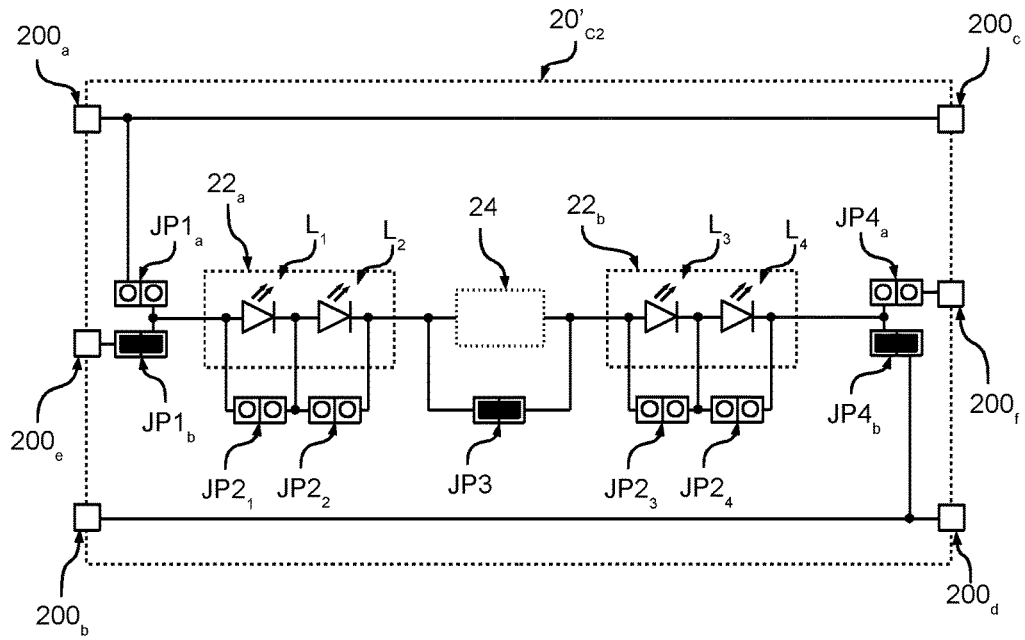

Specifically, FIGS. 11a and 11b show two lighting modules $20'_{C1}$ and $20'_{C2}$.

Specifically, the module $20'_{C1}$ shown in FIG. 11a substantially corresponds to the module described with reference to FIG. 8, the only difference being that the means JP4 are configured to connect the negative terminal of the last LED string 22b to the terminal 200f For example, in the presently considered embodiment, a link short-circuits the connector/electric contact $JP4_a$.

On the other hand, the module $20'_{C2}$ shown in FIG. 11b substantially corresponds to the module described with reference to FIG. 8, the only difference being that the means JP1 are configured to connect the positive terminal of the first LED string 22a to the terminal 200e. For example, in the presently considered embodiment, a link short-circuits the connector/electric contact $JP1_b$.

Figure 12A:
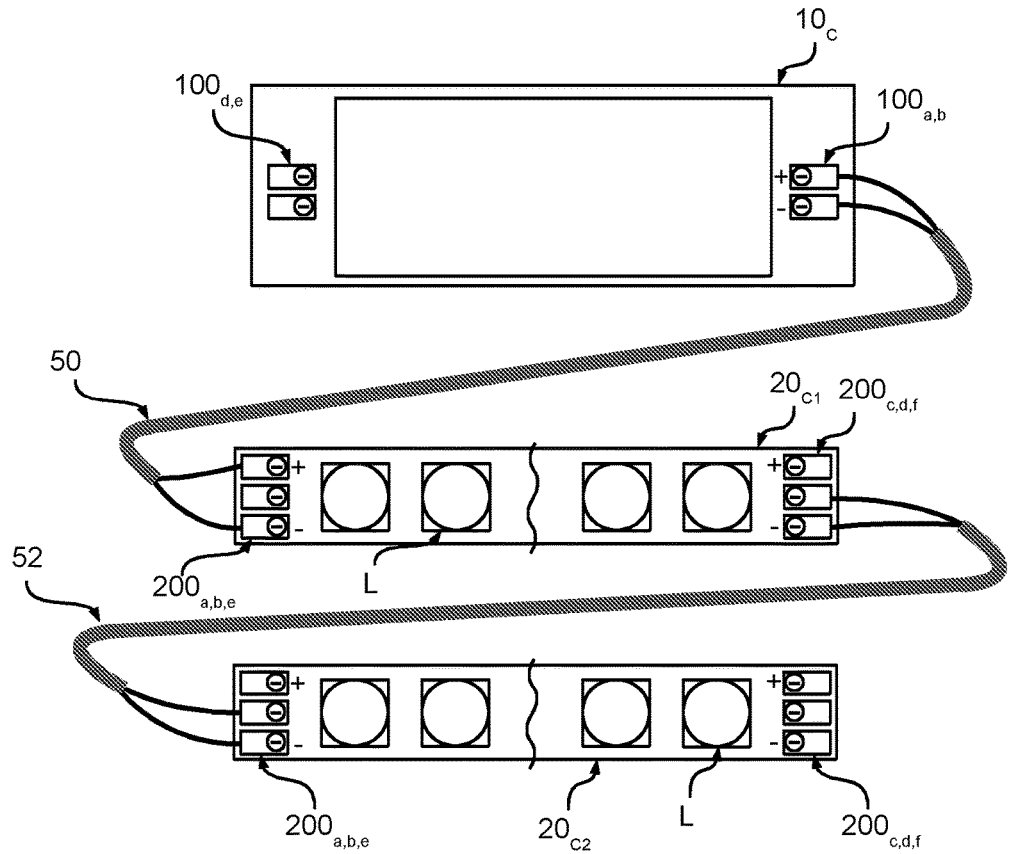
FIGS. 12a and 12b show an embodiment of the connection of a plurality of lighting modules to an electronic converter configured to provide a regulated current.

For example, FIG. 12a shows a possible connection of the lighting system as a whole.

Specifically, in the presently considered embodiment, the first lighting module $20_{C1}$ (specifically the terminals 200a and 200b) is connected to the electronic converter 10 (specifically to the terminals 100a and 100b) by means of a first electric cable 50, having e.g. two wires. Moreover, the second lighting $20_{C2}$ (specifically the terminals 200e and 200b) is connected to the first lighting module $20_{V1}$ (specifically to the terminals 200f and 200d) by means of a first electric cable 52, having e.g. two wires.

Figure 12B:
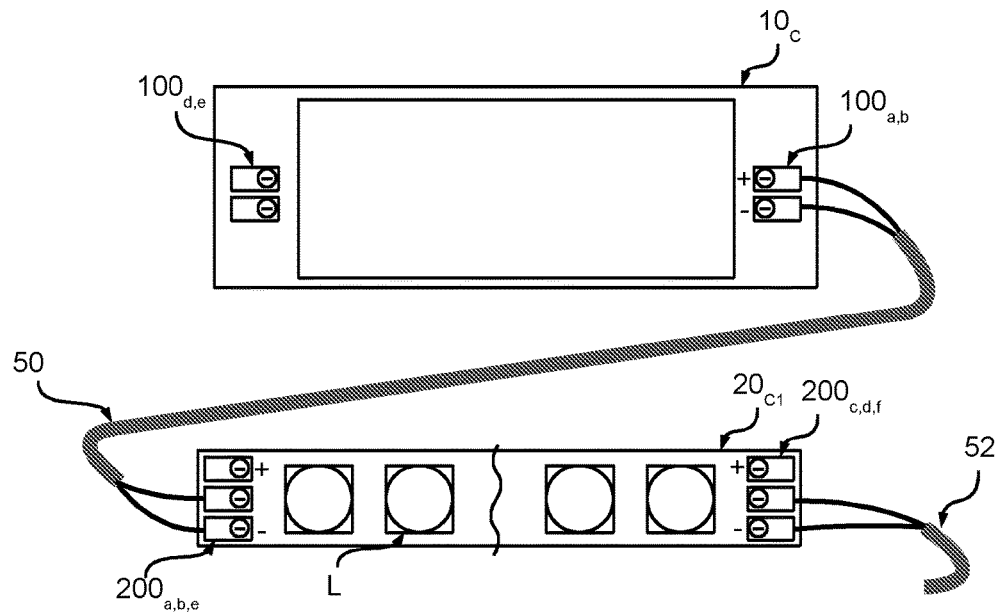

On the other hand, FIG. 12b shows a second embodiment substantially corresponding to the embodiment shown in FIG. 12a, the only difference consisting in the first lighting module $20_{C1}$ being connected to the electronic converter 10 by using terminal 200e instead of terminal 200a. In this case, the means JP1 are therefore configured to connect the positive terminal of the first LED string 22a to terminal 200e, for example by means of a link which short-circuits the connector/electric contact $JP1_b$.

Generally speaking, also in this case only one printed circuit board might be used, which again includes a string of modules 20' as shown with reference to FIG. 10, be re-arranging the electric connection thereof.

Generally speaking, even more than two modules $20'_C$ may be connected in series. In this case it is only necessary to configure the intermediate modules so that the means JP1 are configured to connect the positive terminal of the first LED string 22a to the terminal 200e, e.g. by means of a link which short-circuits the connector/electric contact $JP1_b$, and the means JP4 are configured to connect the negative terminal of the last LED string 22b to the terminal 200f, e.g. by means of a link which short-circuits the connector/electric contact $JP4_a$.

The terminals 100e and 100f which enable a connection in series of the LEDs L of a plurality of modules 20' may be useful also in presence of a voltage driving.

Figure 13A:
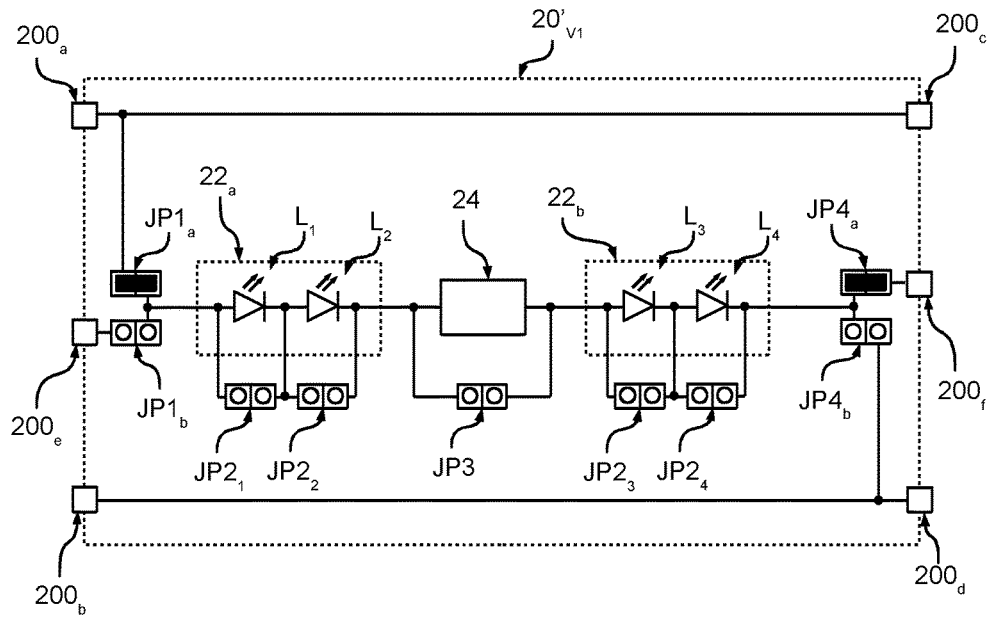
FIGS. 13a, 13b, 14a and 14b show various embodiments of the arrangement of the electric circuit of FIG. 6, in order to implement lighting modules connected in cascade.
Figure 13B:
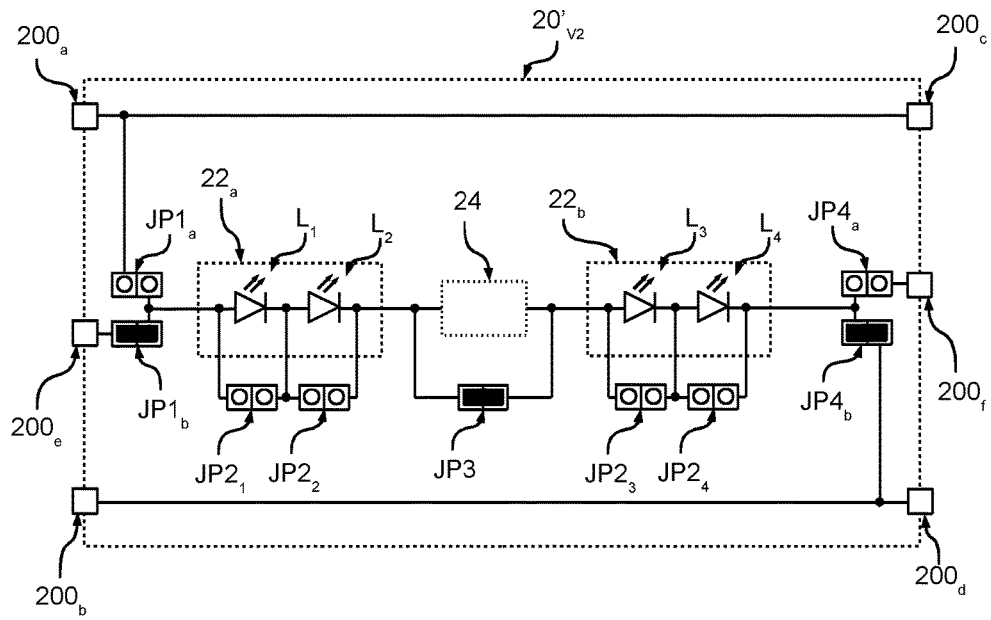

For example, FIGS. 13a and 13b show two lighting modules $20'_{V1}$ and $20'_{V1}$ substantially having the same connection as shown with reference to FIGS. 11a e 11b, the only difference being that the current regulator 24 is implemented in one of both modules, e.g. in module $20'_{V1}$.

Therefore, in the presently considered embodiment, the LED strings 22a and 22b of both modules $20'_{V1}$ and $20'_{V1}$ and a single current regulator 24 are connected in series. By resorting to such a connection, the electronic converter $10_V$ should therefore also provide the double voltage $V_{out}$. For example, if each of the modules $20'_{V1}$ and $20'_{V1}$ includes six LEDs, converter $10_V$ should provide a voltage of approximately 48 VDC.

On the other hand, if converter $10_V$ provides a lower voltage, the means JP2 may be used in order to bypass, i.e. deactivate, one or more of the LEDs L, so that the voltage of the LEDs is lower than the voltage provided by the electronic converter $10_V$.

Figure 14A:
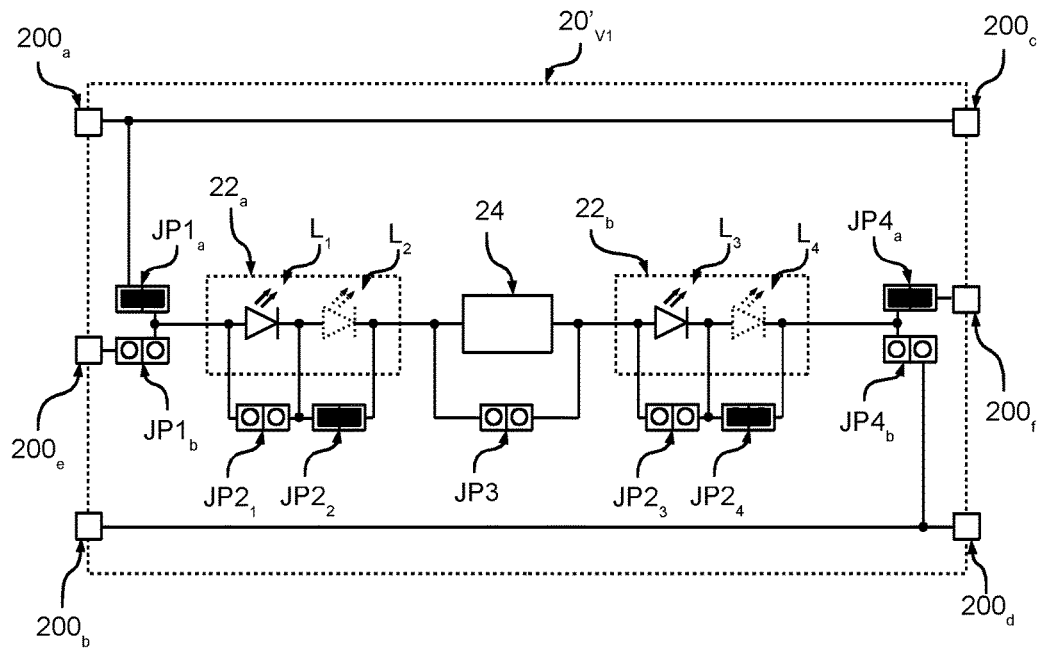
Figure 14B:
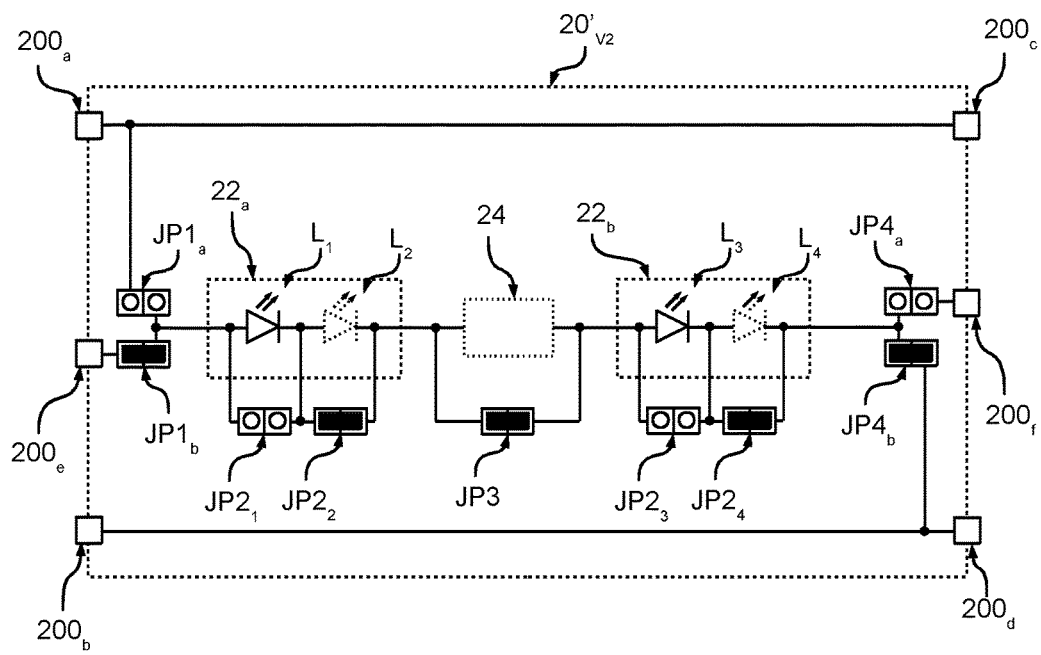

For example, this is shown in FIGS. 14a and 14b, wherein the means JP2 are configured to bypass the LEDs $L_2$ and $L_4$ of both modules $20'_{V1}$ and $20'_{V1}$. For example, in the presently considered embodiment, a link short-circuits the connectors/electric contacts $JP4_2$ and $JP4_4$ of both modules $20'_{V1}$ and $20'_{V1}$. In this case, the respective LEDs L may not be mounted on the printed circuit board.

This connection therefore modifies the number of LEDs which are activated in each lighting module 20', thereby also varying the LED pitch.

Therefore, the means JP2 may be used to adapt the voltage of each lighting module $20'_V$ to the voltage provided by the electronic converter $10_V$. For example, by bypassing some given LEDs in the lighting module $20'_V$ shown in FIG. 7, said module may also be used with an electronic converter $10_V$ providing a voltage of 12 VDC.

On the contrary, in a lighting module $20'_C$, i.e. with current driving, said means enable adapting the number of LEDs to the specific requirements.

Generally speaking, the means JP2 must not necessarily be configured so as to enable a deactivation of all the LEDs L.

Figure 15:
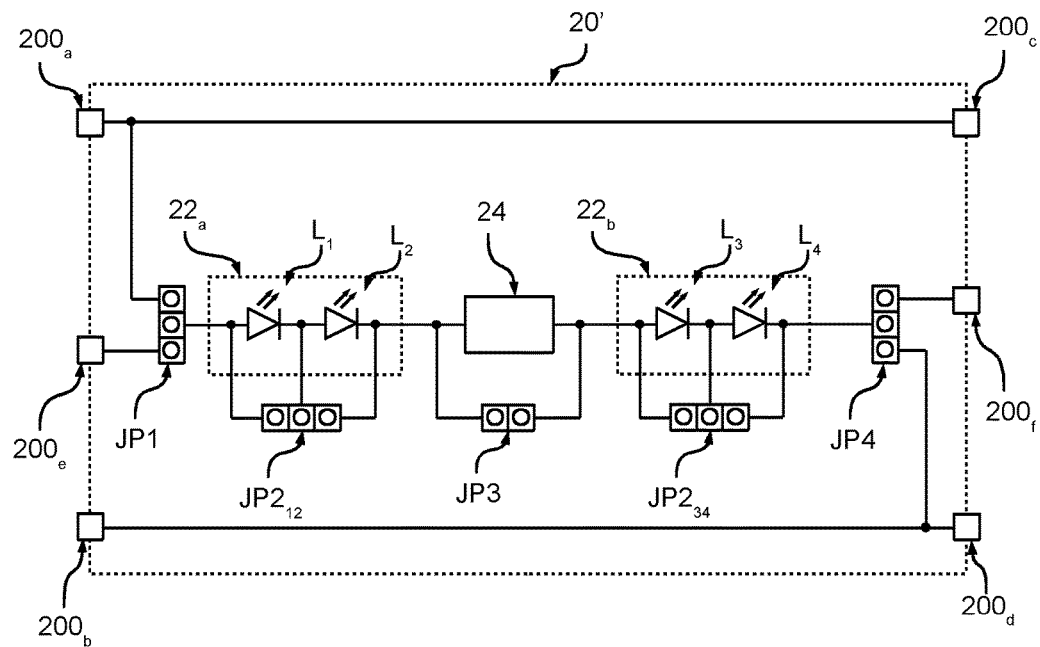
FIGS. 15, 16, 17 and 18 show further embodiments of the electric circuit of a printed circuit board of a lighting module according to the present specification.

For example, FIG. 15 shows an embodiment wherein respectively two consecutive LEDs $L_1/L_2$ and $L_3/L_4$ have means $JP_{12}$ and $JP_{34}$ associated thereto which enable:
 the activation of both LEDs $L_1/L_2$ and $L_3/L_4$;
 the activation of the first LED $L_1$ or $L_3$; or
 the activation of the second LED $L_2$ or $L_4$.

Figure 16:
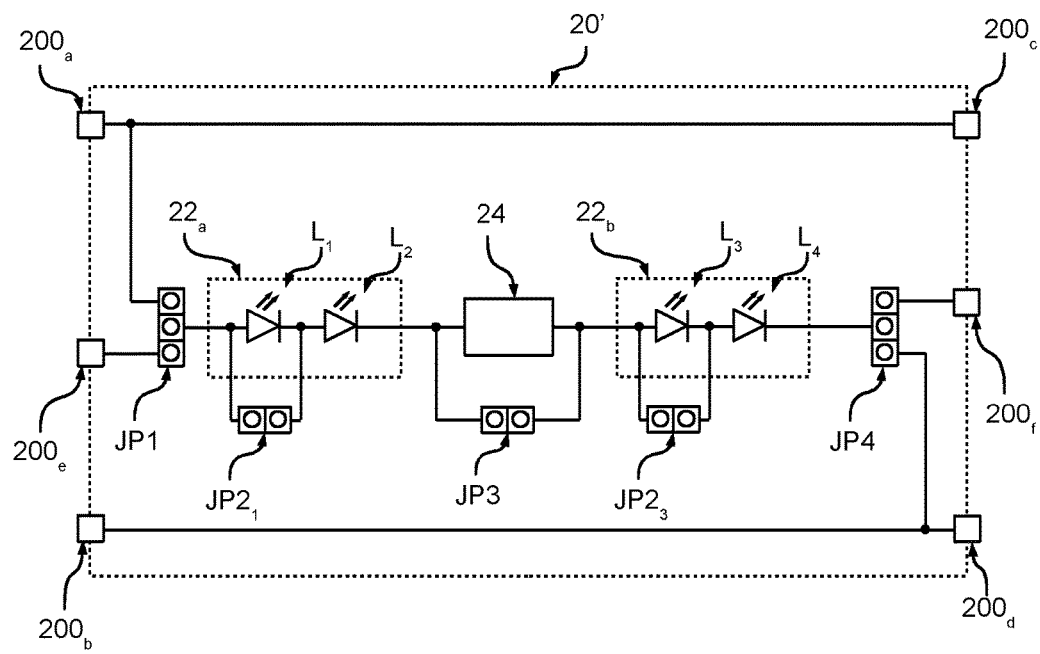

On the other hand, FIG. 16 shows an embodiment wherein some LEDs, e.g. LEDs $L_2$ and $L_4$, are always active, while other LEDs, e.g. LEDs $L_1$ and $L_3$ may have respective means JP2 associated thereto.

Therefore, generally speaking, one or more LEDs L of the lighting module 20' according to the present description have means JP2 associated thereto enabling a selective bypass of LED L.

As mentioned in the foregoing, the means JP1-JP4 may be implemented also via other electric contacts between two electric contacts, such as e.g. two metallic zones on a printed circuit board which are not covered by the solder mask. Specifically, such electric connection substantially corresponds to a switch, and therefore may have two operating conditions:
 a first condition wherein the electric connection between both contacts is closed; and
 a second condition wherein the electric connection between both contacts is interrupted.

Therefore, generally speaking, said connections may be normally open or closed.

Specifically, when the connection is normally open, the circuit includes two contacts which may be closed by means of a link, e.g. by using connectors, or by soldering the link directly onto the respective contacts of the printed circuit board.

Figure 17:
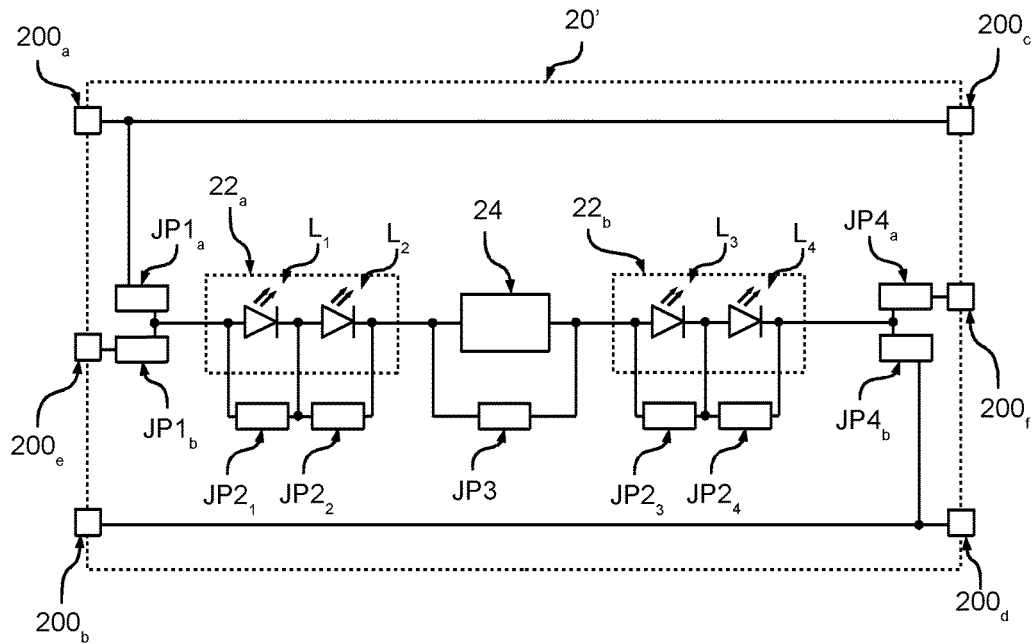

For example, FIG. 17 shows an embodiment wherein the means JP1-JP4 are implemented via (optionally zero-Ohm) resistors, which may be selectively attached to the printed circuit board. As a consequence, the printed circuit board includes metallic zones for mounting such resistors, even though the resistors are not necessarily mounted onto the printed circuit board. For example, said metallic zones may have a shape according to a SMD format 1H (0201), 1E (0402), 1J (0603), 2A (0805) or 2B (1206).

On the other hand, when the connection is normally closed, the printed circuit board includes two contacts which are connected to each other via an electric trace on the printed circuit board, and the metallic material between both contacts may be removed or at least interrupted by means of an etching operation, e.g. by mechanical means or via a laser. For example, this applies to electric traces which may be interrupted e.g. by laser etching.

Figure 18:
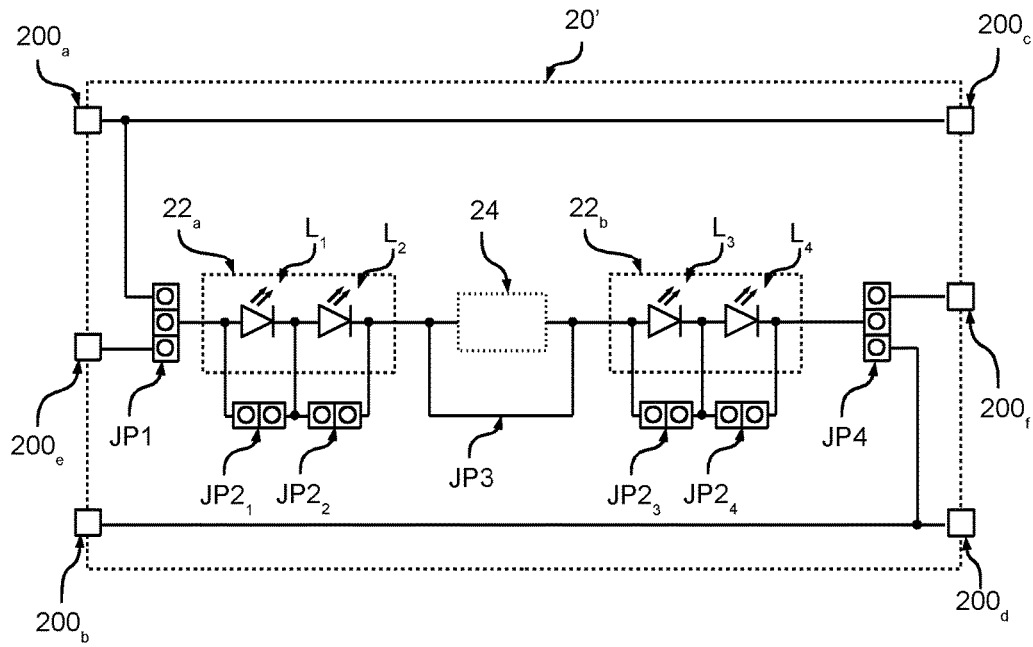

For example, FIG. 18 shows an embodiment having a bypass electric trace JP3 which therefore short-circuits the terminals of current regulator 24. If such a current regulator is required, the trace JP3 may be interrupted by etching.

Figure 19:
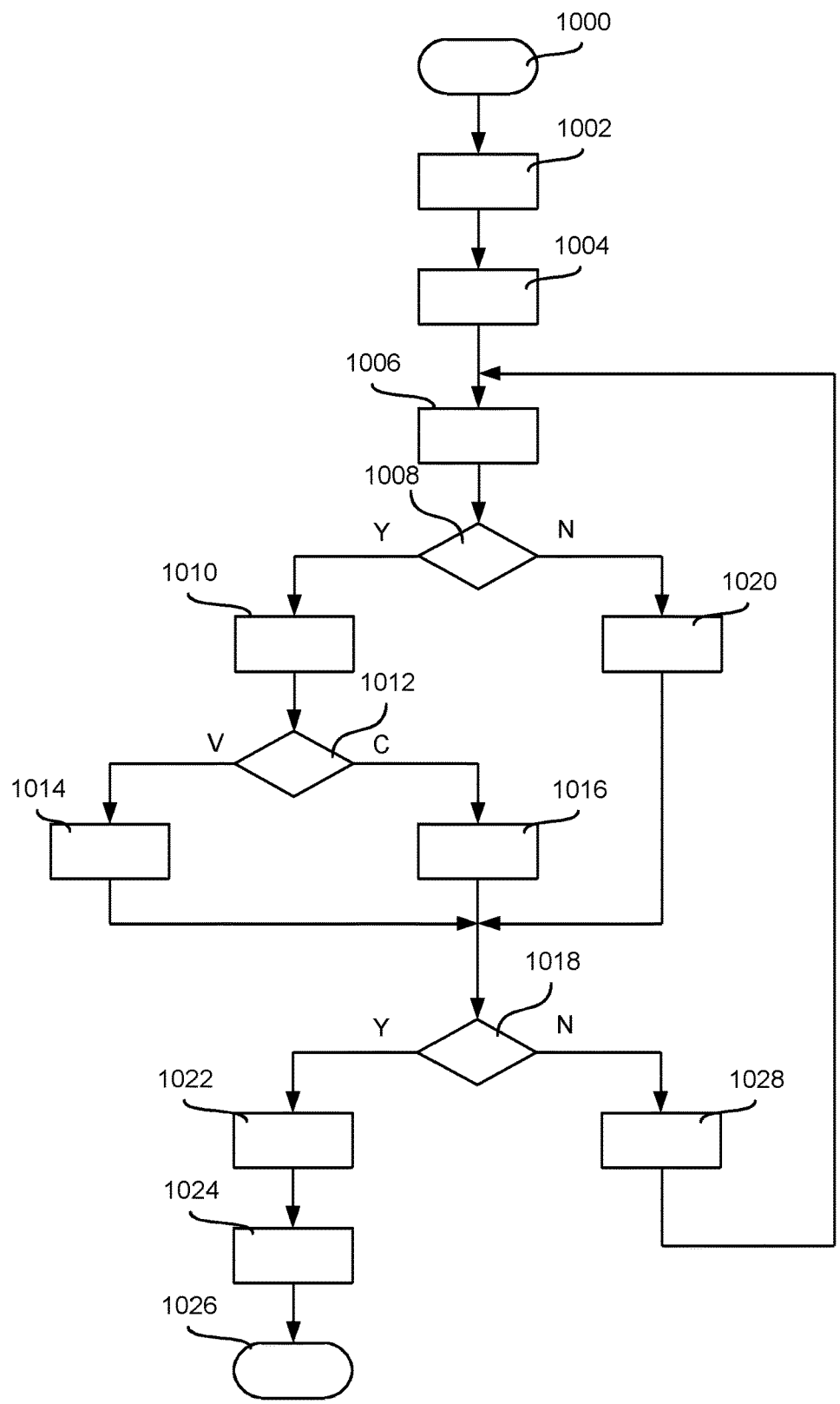
FIG. 19 shows an embodiment of a method for implementing lighting modules.

FIG. 19 shows a corresponding method for implementing lighting modules 20'.

After a starting step 1000, step 1002 envisages designing the electric circuit of the lighting module 20' as described in the foregoing.

Specifically, in various embodiments the maximum number of LEDs is determined which the lighting modules may comprise, such as e.g. six LEDs L, i.e. one or more LED strings 22 are implemented. Moreover, as described e.g. with reference to FIGS. 5, 6, 15, 16, 17 and 18, for each LED L the respective selection means JP2 are chosen, i.e. for each LED L it is determined whether said LED includes bypass means JP2 and how such bypass means are implemented (normally open or closed; connector or only contacts, etc.). Specifically, in various embodiments, at least one LED of the lighting module 20' includes such a bypass, such as e.g. two contacts which may be short-circuited by means of an SMD, e.g. zero-Ohm, resistor.

Moreover, the terminals 200a-200f of the lighting module 20' and the corresponding connection between the terminals 200a and 200c, and 200b and 200d are designed. Moreover, the corresponding selection means JP1 and JP2 are designed which enable connecting the LEDs L to the terminals 200a-200f (see FIGS. 5 and 6).

In various embodiments, there is moreover provided a circuit of a current regulator 24, connected in series with the LEDs L, and the corresponding selection means JP3 are designed.

As shown with reference to FIG. 10, said electric circuit may also envisage a connection in series of a plurality of lighting modules 20', i.e. a connection of the terminals 200c, 200d and 200f of a lighting module 20' to the terminals 200a, 200b and 200e of the previous lighting module 20' (if said module is not the first in the chain).

In a step 1004, the corresponding printed circuit board is implemented on the basis of the electric circuit designed in step 1002.

Therefore, after step 1004 a printed circuit board is provided which may include contacts and electric traces, in order to implement one or more lighting modules 20' connected in series. Therefore, the corresponding components must be soldered onto said printed circuit board in order to implement the lighting modules 20'.

For example, in a step 1006, the first module of the printed circuit board is chosen, and the number of LEDs L is determined which said module is supposed to include. Subsequently, said LEDs L are soldered onto the printed circuit board, and optionally the selection means JP2 are set in order to bypass the connection terminals of unused LEDs (see for example FIGS. 14a and 14b).

In a step 1008, it is determined whether said lighting module 20' is a single module or the first module in a chain.

If the lighting module 20' is a single module or the first module in a chain (result "Y" in step 1008), step 1010 envisages the setting of the means JP1 in such a way as to connect the positive terminal of the first LED string 22a to the positive terminal of the electronic converter 10, e.g. by short-circuiting the connectors/electric contacts JP1$_a$ (or JP1$_b$ as previously described with reference to the FIGS. 12a and 12b).

In a subsequent step 1010, it is moreover determined whether the lighting module 20' is supplied with a regulated voltage or current.

If the lighting module 20' is supplied with a regulated voltage (result "V" of step 1012), in a step 1014 the components of the current regulator 24 are mounted and the corresponding selection means JP3 are set so that the current regulator 24 is not bypassed.

On the other hand, if module 20' is supplied with a regulated current (result "C" of step 1012), the corresponding selection means JP3 are set in such a way as to bypass the electric contacts of the current regulator 24.

On the other hand, if module 20' is a following module in a module chain, i.e. if module 20' is neither a single module nor the first module of a chain (result "N" of step 1008), in a step 1020 the means JP1 are set in such a way as to connect the positive terminal of the first LED string 22a to the terminal 200e of module 20', e.g. by short-circuiting the connectors/electric contacts JP1$_b$.

Therefore, in the presently considered embodiment, the current regulator 24 is activated only if the module is supplied with voltage and if said module is a single module or the first module in a chain. However, generally speaking, regulator 24 may also be activated in a following module of the chain.

At the end of the steps 1014, 1016 and 1020, a further step 1018 involves determining the connection of the means JP4. Specifically, in step 1018, it is determined whether the lighting module 20' is a single module or the last module in a chain of lighting modules.

If lighting module 20' is not a single module or the last module in a chain (result "N" of step 1018), in a step 1028 the means JP4 are set in such a way as to connect the negative terminal of the last string of LEDs 22b to the terminal 200f, e.g. by short-circuiting the connectors/electric contacts JP4$_a$. Moreover, the method proceeds to the step 1006 for determining the configuration of the next/following lighting module 20' in the chain.

On the other hand, if the lighting module 20' is a single module or the last module of a chain (result "Y" of step 1018), in a step 1022 the means JP4 are set in such a way as to connect the negative terminal of the last LED string 22b to the negative terminal of the electronic converter 10, i.e. to the terminal 200b, e.g. by short-circuiting the connectors/electric contacts JP4$_b$.

If the lighting modules in the chain are mounted on the same printed circuit board, a step 1024 may be envisaged wherein the printed circuit board is cut after the current lighting module 20', because said module 20' is a single module or the last module in a chain of lighting modules.

Finally, the process ends at an end step 1026.

Generally speaking, instead of performing said assembly step by step, the selection of the arrangement, the corresponding mounting of components and the optional separation of modules 20' may also be carried out one after the other.

The presently described solutions enable therefore the implementation of single lighting modules or of chains of lighting modules (which are connected via cables or are placed on one and the same printed circuit board) which may be supplied with a regulated voltage or current.

Figure 20A:
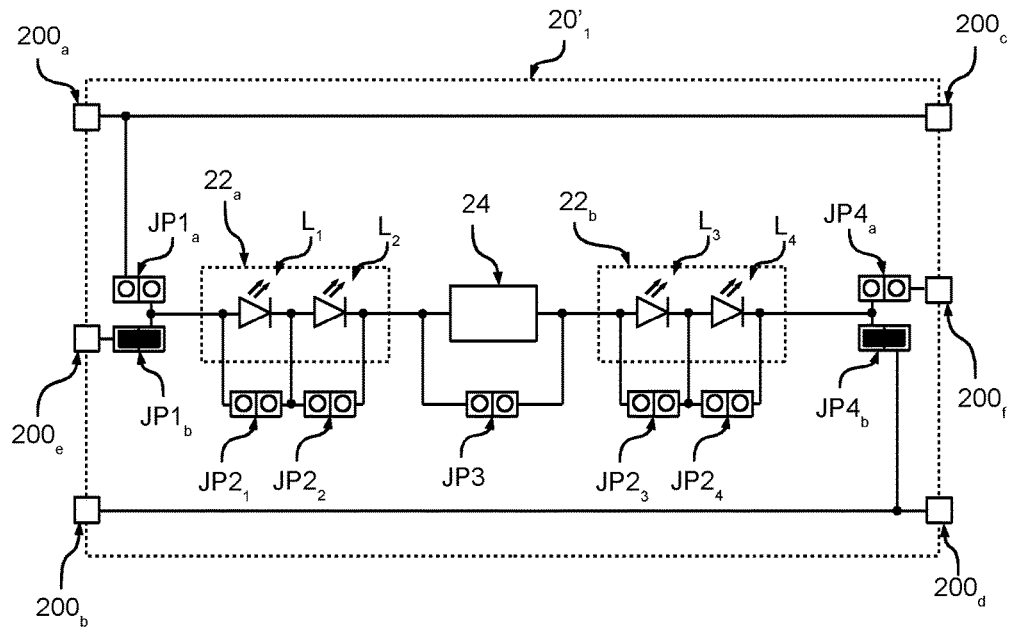
FIGS. 20a and 20b show a further embodiment of the arrangement of the electric circuit of FIG. 6.
Figure 20B:
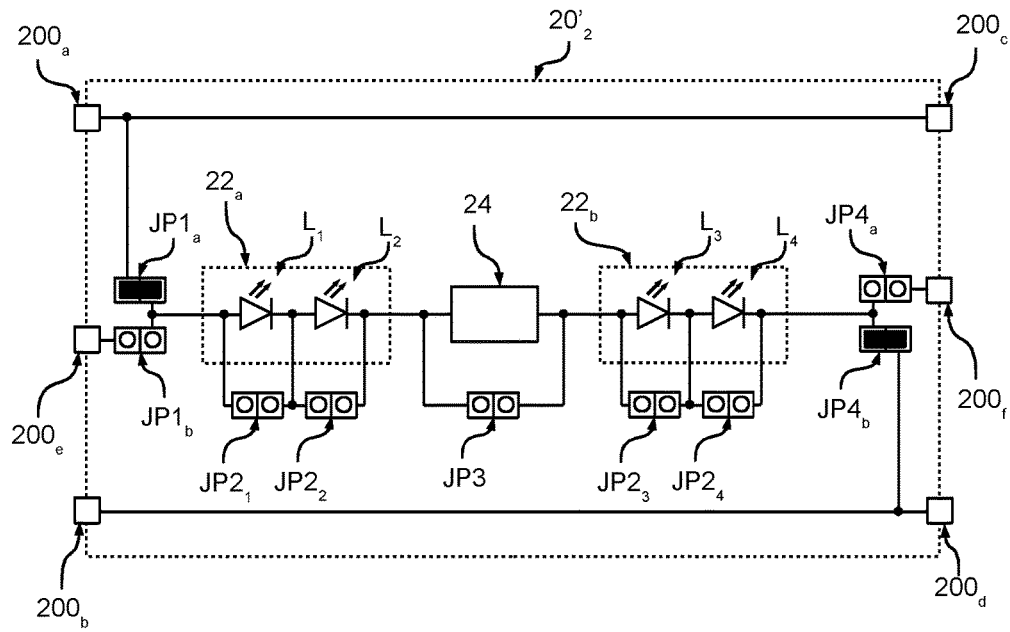

Generally speaking, the LEDs of the various lighting modules 20' of a chain/string of lighting modules 20' as shown in FIG. 10 are not necessarily connected in series. Indeed, as shown in FIGS. 20a and 20b, a first module 20'$_1$ may be configured so that the respective LEDs L are connected in series between the terminals 200e and 200b, and a second module 20'$_2$ may be configured so that the respective LEDs L are connected in series between the terminals 200a and 200b. Therefore, an electronic converter 10 providing two supply signals may provide the first supply signal to the terminal 200e of the first module 20'$_1$, therefore supplying the LEDs of the first module 20'$_1$. Moreover, the electronic converter 10 may provide the second supply signal to the terminal 200a of the first module 20'$_1$, which is therefore also sent to terminal 200a of the second module 20'$_2$, thereby supplying the LEDs L of the second module 20'$_2$.

For example, if LEDs L having different spectral characteristics are mounted into modules 20'$_1$ and 20'$_2$, this sort of driving may be used to regulate the colour of the light emitted by the system.

Of course, without prejudice to the principle of the present disclosure, the implementation details and the embodiments may vary, even appreciably, with respect to what has been described herein by way of non-limiting example only, without departing from the extent of protection of the present disclosure as defined by the annexed claims.

For example, if modules 20' have to only support a supply with a regulated current, the terminal 200c may also be omitted, because such a terminal has the main function of enabling a parallel connection of a plurality of LED strings (see FIG. 9).

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

What is claimed is:

1. A printed circuit board comprising metallic zones comprising:
    a first, a second and a third positive terminal,
    a first and a second negative terminal, wherein the second negative terminal is connected to said first negative terminal, and
    electric contacts for the mounting of one or more LEDs and electric traces such that said one or more LEDs are connected in series forming a LED string;
    wherein said printed circuit board comprises selection means implemented with electric traces and metallic contacts adapted to be short-circuited via links in order to permit all of the following connections:
    a connection of said LED string between the first positive terminal and the third positive terminal,
    a connection of said LED string between the first positive terminal and the first negative terminal,
    a connection of said LED string between the second positive terminal and the third positive terminal, and
    a connection of said LED string between the second positive terminal and the first negative terminal.

2. The printed circuit board as claimed in claim 1, wherein said selection means comprise:
    a first set of two contacts connected between said first positive terminal and the positive terminal of said LED string;
    a second set of two contacts connected between said second positive terminal and the positive terminal of said LED string;
    a third set of two contacts connected between the negative terminal of said LED string and the third positive terminal; and
    a fourth set of two contacts connected between the negative terminal of said LED string and the first negative terminal.

3. The printed circuit as claimed in claim 2, wherein said two contacts of said first, second, third and fourth set are metallic contacts with a SMD format 1H/0201, 1E/0402, 1J/0603, 2A/0805 or 2B/1206.

4. The printed circuit board as claimed in claim 2, wherein:
    either said two contacts of said first set or said two contacts of said second set are closed through a link; and
    either said two contacts of said third set or said two contacts of said fourth set are closed through a link.

5. The printed circuit board as claimed in claim 1, wherein said printed circuit board comprises a fourth positive terminal connected to said first positive terminal.

6. The printed circuit board as claimed in claim 1, wherein said printed circuit board comprises bypass means implemented with electric traces and/or metallic contacts configured to be short-circuited for selectively bypassing one or more of said LEDs.

7. The printed circuit board as claimed in claim 1, wherein said printed circuit board comprises:
    electric contacts for the mounting or the implementation of a current regulator; and
    further bypass means implemented with electric traces and/or metallic contacts configured to be short-circuited for selectively bypassing said current regulator.

8. A lighting system comprising:
    an electronic converter configured to provide a regulated voltage or current; and
    one or more lighting modules comprising one or more printed circuit boards comprising metallic zones comprising:
    a first, a second and a third positive terminal,
    a first and a second negative terminal, wherein the second negative terminal is connected to said first negative terminal, and
    electric contacts for the mounting of one or more LEDs and electric traces such that said one or more LEDs are connected in series forming a LED string;
    wherein said printed circuit board comprises selection means implemented with electric traces and metallic contacts adapted to be short-circuited via links in order to permit all of the following connections:
    a connection of said LED string between the first positive terminal and the third positive terminal,
    a connection of said LED string between the first positive terminal and the first negative terminal,
    a connection of said LED string between the second positive terminal and the third positive terminal, and
    a connection of said LED string between the second positive terminal and the first negative terminal; and
    a one or more LEDs mounted on said one or more printed circuit boards.

9. A method of implementing lighting modules, comprising the steps of:
    implementing a printed circuit board comprising metallic zones comprising:
    a first, a second and a third positive terminal, a first and a second negative terminal, wherein the second negative terminal is connected to said first negative terminal, and electric contacts for the mounting of one or more LEDs and electric traces such that said one or more LEDs are connected in series forming a LED string;

wherein said printed circuit board comprises selection means implemented with electric traces and metallic contacts adapted to be short-circuited via links in order to permit all of the following connections:

a connection of said LED string between the first positive terminal and the third positive terminal, a connection of said LED string between the first positive terminal and the first negative terminal, a connection of said LED string between the second positive terminal and the third positive terminal, and a connection of said LED string between the second positive terminal and the first negative terminal;

soldering one or more LED on said printed circuit board in order to form a LED string;

determining whether the lighting module is a single lighting module or belongs to a lighting module string;

if said lighting module belongs to a lighting module string, determining whether the lighting module is the first or the last lighting module of the lighting module string, and if the lighting module is the first lighting module of the lighting module string, setting said selection means such that said LED string is connected between the first positive terminal and the third positive terminal or between the second positive terminal and the third positive terminal; and if said lighting module is the last lighting module of the lighting module string, setting said selection means such that said LED string is connected between the second positive terminal and the first negative terminal.

10. The method as claimed in claim 9, comprising:

if said lighting module is a single lighting module, setting said selection means such that said LED string is connected between the first positive terminal and the first negative terminal or between the second positive terminal and the first negative terminal.

\* \* \* \* \*